United States Patent [19]

Westwood et al.

[11] Patent Number: 4,612,484
[45] Date of Patent: Sep. 16, 1986

[54] TELEVISION RECEIVERS

[75] Inventors: James S. Westwood; Peter H. Maydew, both of Cambridge, England

[73] Assignee: Sinclair Research Limited, Cambridge, England

[21] Appl. No.: 650,219

[22] Filed: Sep. 13, 1984

[30] Foreign Application Priority Data

Sep. 15, 1983 [GB] United Kingdom ............... 8324694

[51] Int. Cl.[4] ........................................... H01J 29/52
[52] U.S. Cl. ................................. 315/384; 315/410; 315/396; 358/165
[58] Field of Search ............ 315/396, 397, 410, 384, 315/385, 386; 358/165, 220

[56] References Cited
U.S. PATENT DOCUMENTS
3,922,585 11/1975 Andrews ............................. 315/396

Primary Examiner—Theodore M. Blum
Attorney, Agent, or Firm—Kane, Dalsimer, Kane, Sullivan and Kurucz

[57] ABSTRACT

A line scanning circuit for an electrostatically deflected cathode ray tube uses two integrator circuits having single transistor amplifiers for complementary conductivity types with capacitive feedback to provide balanced sawtooth drive waveforms. The charges on the capacitors are reset by pulses at line frequency and the forward sweeps of the sawteeth are produced by current flowing from the input of one integrator to the input of the other integrator. A variable resistor in the current path provides width control and a transistor connected in series with the current path enables dynamic adjustment of the scan to be provided to suit the scanning characteristics of a flat cathode ray tube. A signal from the field scanning circuit during flyback is applied to turn off the transistor in the current path so that the spot is returned during field flyback up one side of the screen.

11 Claims, 6 Drawing Figures

TELEVISION RECEIVERS

This invention relates to television receivers.

Small, portable, battery-operated television receivers have been manufactured in the past but only recently has it become practicable to construct such receivers which are sufficiently small to be carried in a pocket, with the production of flat, cathode ray display tubes and other compact display devices. A disadvantage with a portable, battery-operated television receiver is that large batteries are heavy and are consequently undesirable, and lighter, smaller batteries do not have a large capacity, so that they have a short useful life and have to be replaced frequently, with an attendant cost penalty. It is therefore essential in such a receiver to keep the current consumption as low as possible. Partly for this reason and partly because of limitations of space it is desirable to include as many of the circuits of the receiver as conveniently possible in a single integrated circuit or possibly a few integrated circuits. A difficulty in the use of integrated circuits for processing signal waveforms such as are employed in television receivers arises because of the variations in the characteristics and the nonideal behaviour of the elements of the circuits which need correction and/or compensation for acceptable performance.

Another problem with battery-operated receivers is that the voltage produced by the battery falls during its useful life, so that regulation of the voltage is desirable for maintaining the required relationships between the various signals employed in producing the display, which otherwise could become distorted. Such regulation is, however, undesirable because of the power which it consumes.

It is therefore an object of the present invention to overcome one or more of the difficulties outlined above. It should, nevertheless, be borne in mind that the invention is applicable to any type of television receiver and not merely to portable, battery-operated ones.

According to one aspect of the present invention there is provided a scanning circuit for a cathode ray tube having electrostatic deflection plates, the circuit producing substantially identical sawtooth voltage waveforms of opposite polarities on two output conductors, wherein the circuit includes two complementary amplifiers each having capacitive feedback to form an integrator circuit and being connected to a respective output conductor, a current path connected between the inputs of the amplifiers providing the current inputs to define the sloping flanks of the sawtooth waveforms, and means for periodically restoring the charges on the capacitors of the integrators to datum values.

The amplifiers may be single bipolar transistors of complementary conductivity type connected in common emitter mode.

The current path may include a variable resistor for setting the amplitude of the sawtooth waveforms and a device for controlling the current through the path during each sloping flank of the sawtooth waveform so as to enable the waveform to be shaped to suit the deflection characteristics of a particular cathode ray tube. The circuit may be used for line scanning of a cathode ray tube and means may be provided to hold the device nonconducting during field flyback so that the spot is held at one side of the screen during that flyback.

The means for restoring the capacitor charges may comprise for each integrator a source of a pulse of appropriate polarity, a diode poled to conduct the pulse to the output of the amplifier and a transistor switch responsive to the pulse to connect the input of the amplifier to a voltage reference point. The pulses may conveniently be derived from a transformer winding driven by line frequency pulses and used to generate an EHT supply for the cathode ray tube.

According to a second aspect of the present invention there is provided cathode ray tube display apparatus having line and field scanning circuits in which a coupling is provided from the field scanning circuit to the line scanning circuit to hold the line deflection at an extreme value during field flyback.

In order that the invention may be fully understood and readily carried into effect it will now be described with reference to the drawings, of which:

Figure 1A:
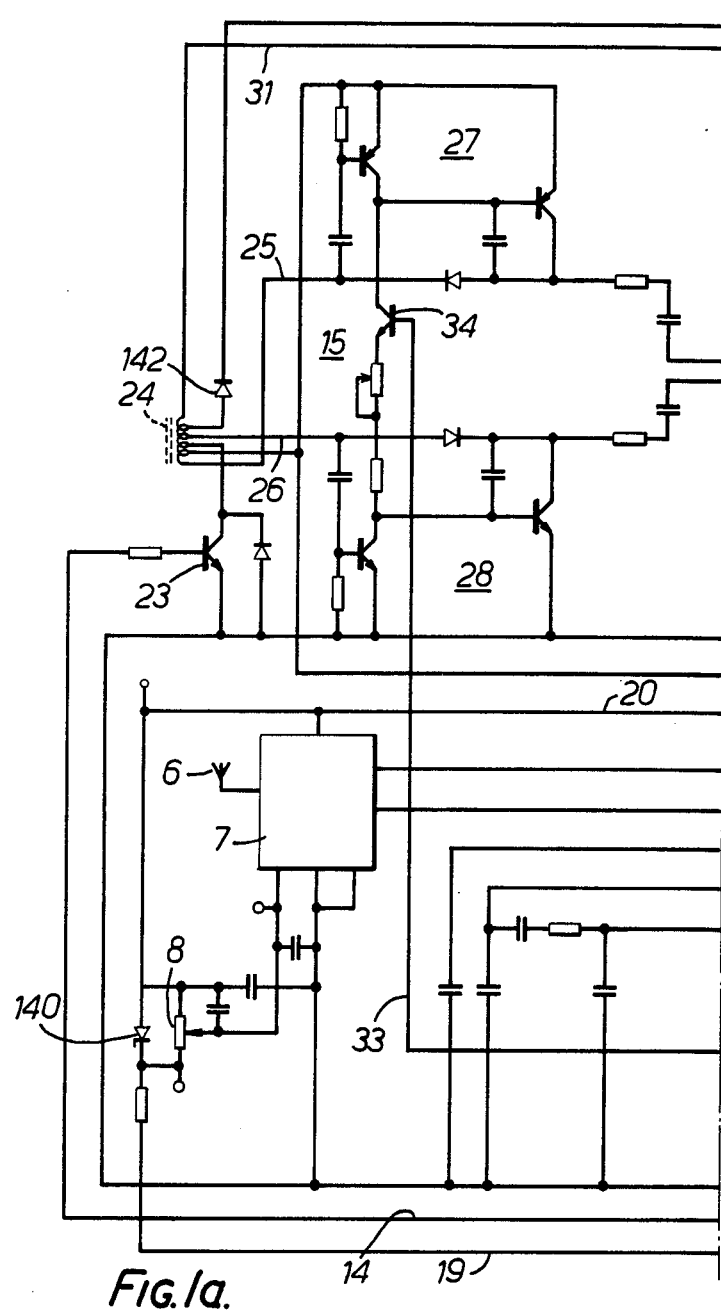
FIGS. 1a–1c show a circuit diagram of one example of a television receiver using the invention.
Figure 1B:
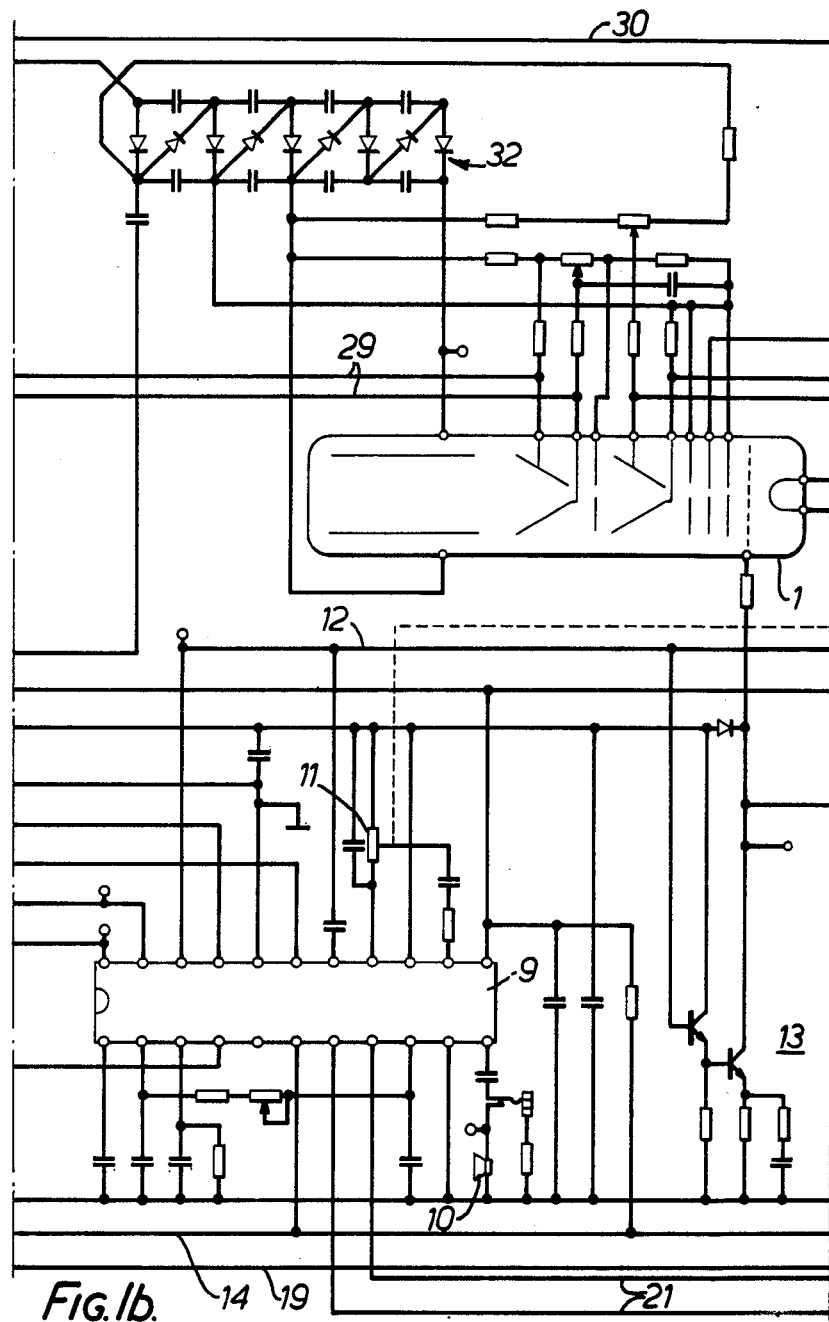
Figure 1C:
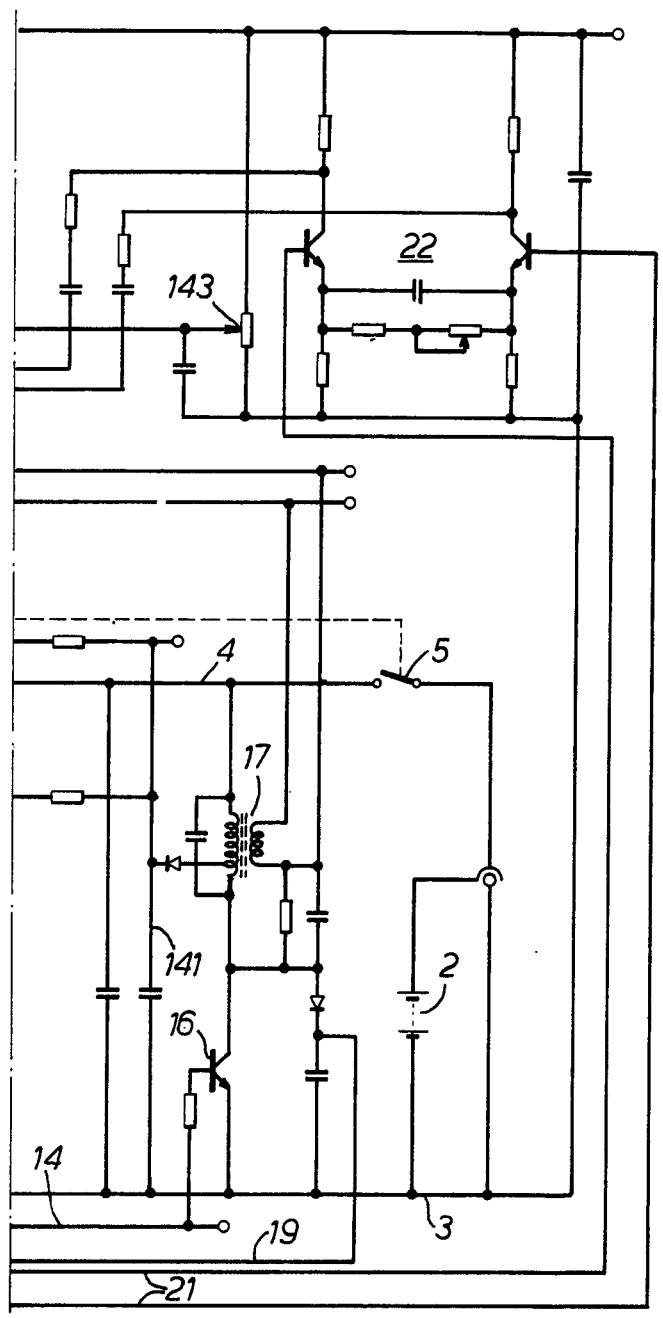

FIG. 1 shows the circuit diagram of one example of a television receiver using the invention. The receiver has a flat electrostatically focussed and deflected cathode ray display tube 1 of the type described in British Patent Specification No. 1 592 571. The receiver is powered by a battery 2 providing 6 volts. The battery 2 is connected between an earthed conductor 3 and a supply conductor 4 to which it is connected by an on/off switch 5. The television signals are picked up by an aerial 6 which is connected to a tuner unit 7 which may be of conventional construction. The tuning of the unit 7 is effected by means of one or more varactor diodes to which an adjustable DC voltage is applied from a tuning potentiometer 8. The intermediate frequency output signal from the tuner unit 7 is applied to an integrated circuit 9, the details of which are shown in block diagrammatic form in FIG. 2 and which contains the video and sound intermediate frequency, signal separation and processing circuits, detector and amplifier stages together with the sync signal separator and the line and field scanning oscillators. The sound output signal is reproduced by a loudspeaker 10, the volume of which is controlled by a potentiometer 11. The video output signal from the integrated circuit 9 is conveyed by a conductor 12 to a further video amplifier 13 consisting of two transistor stages, the output of which is connected to the grid of the cathode ray tube 1. The line scan signals are applied via a conductor 14 to the line scanning circuit 15 and also to a transistor 16 which operates as a switch to interrupt the DC supply to the primary of a transformer 17 which feeds pulses to produce to produce a 15 volt supply for the video circuits on the line 12. The secondary winding of the transformer 17 supplied the energisation for the heater of the cathode ray tube 1 and this is connected to the collector of the transistor 16 so that the positive-going pulses serve to blank the spot during line flyback. From the collector of the transistor 16 a supply voltage is derived which is established on a conductor 19 and is used to provide the tuning voltage of the tuner 7 via the potentiometer 8. A supply of 3 volts is set up on a supply conductor 20 by a part of the integrated circuit 9 to power the tuner unit 7. The field scan signal for the cathode ray tube 1 is supplied by the integrated circuit 9 via conductors 21 which are connected through a field scan amplifier 22 to the field scan electrodes of the cathode ray tube 1.

The line scanning circuit 15 receives the line drive signal supplied via the conductor 14 at the base of a transistor 23 which switches current through an autotransformer 24. Two outputs from the autotransformer 24 on conductors 25 and 26 supply similar pulses of opposite polarities to switched integrators 27 and 28 respectively which generate saw-tooth waveforms with flybacks caused by the pulses on the conductors 25 and 26, the saw-tooth waveforms being conveyed via conductors 29 to the line signal deflection electrodes of the cathode ray tube 1. The autotransformer 24 also supplies high voltage pulses along a conductor 30 to supply the field amplifier 22 and further high voltage pulses on a conductor 31 for driving a diode-capacitor stack 32 which generates the various EHT voltages for the cathode ray tube 1. A further output from the integrated circuit 9 is fed along a conductor 33 to control the conductivity of a transistor 34 which determines the slopes of the flanks of the saw-teeth by regulating the current fed to the integrators. This control is required because the cathode ray tube 1 is a flat tube with the screen end on to the electron gun.

Figure 2A:
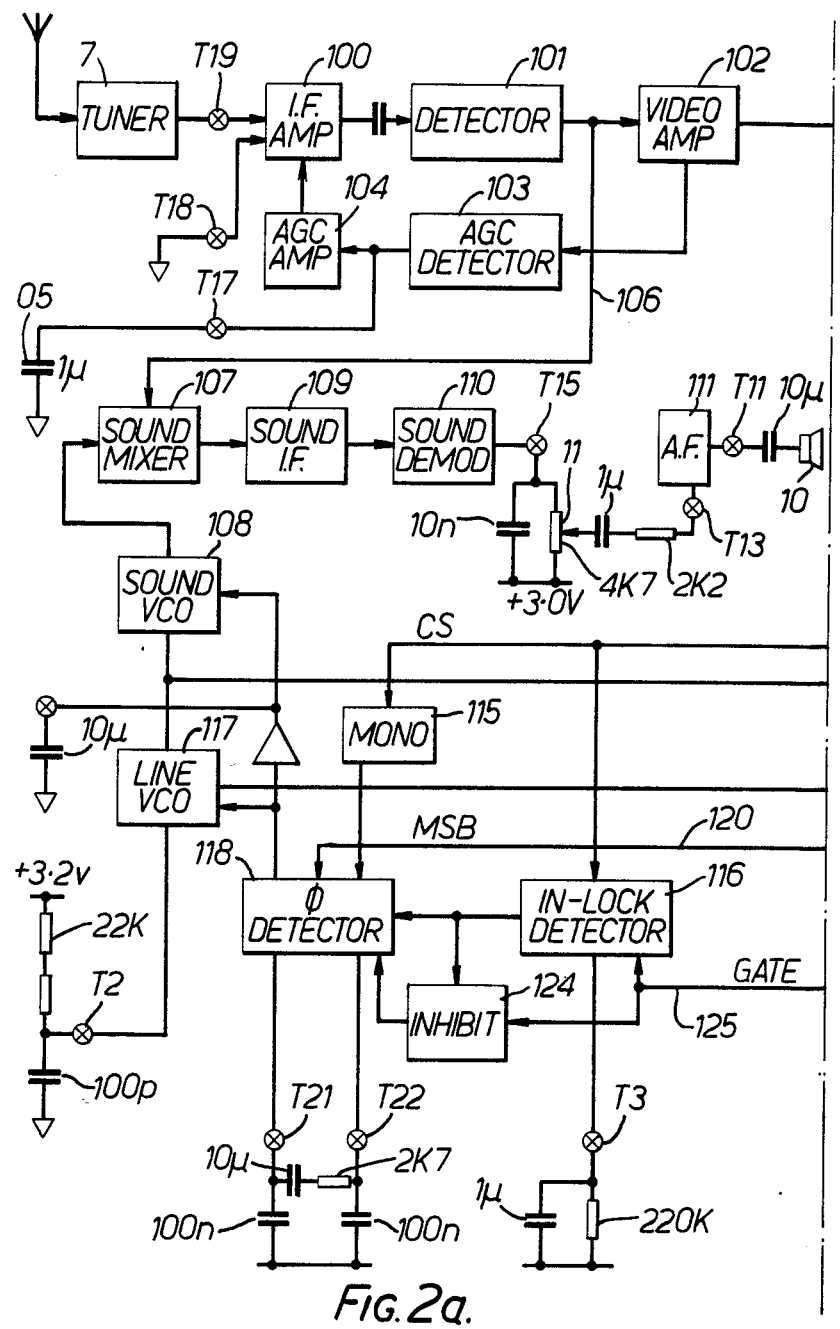
FIGS. 2a and 2b show a block diagram of the circuits contained in the integrated circuit 9 of FIG. 1 together with some of the external components which are shown in that Figure.
Figure 2B:
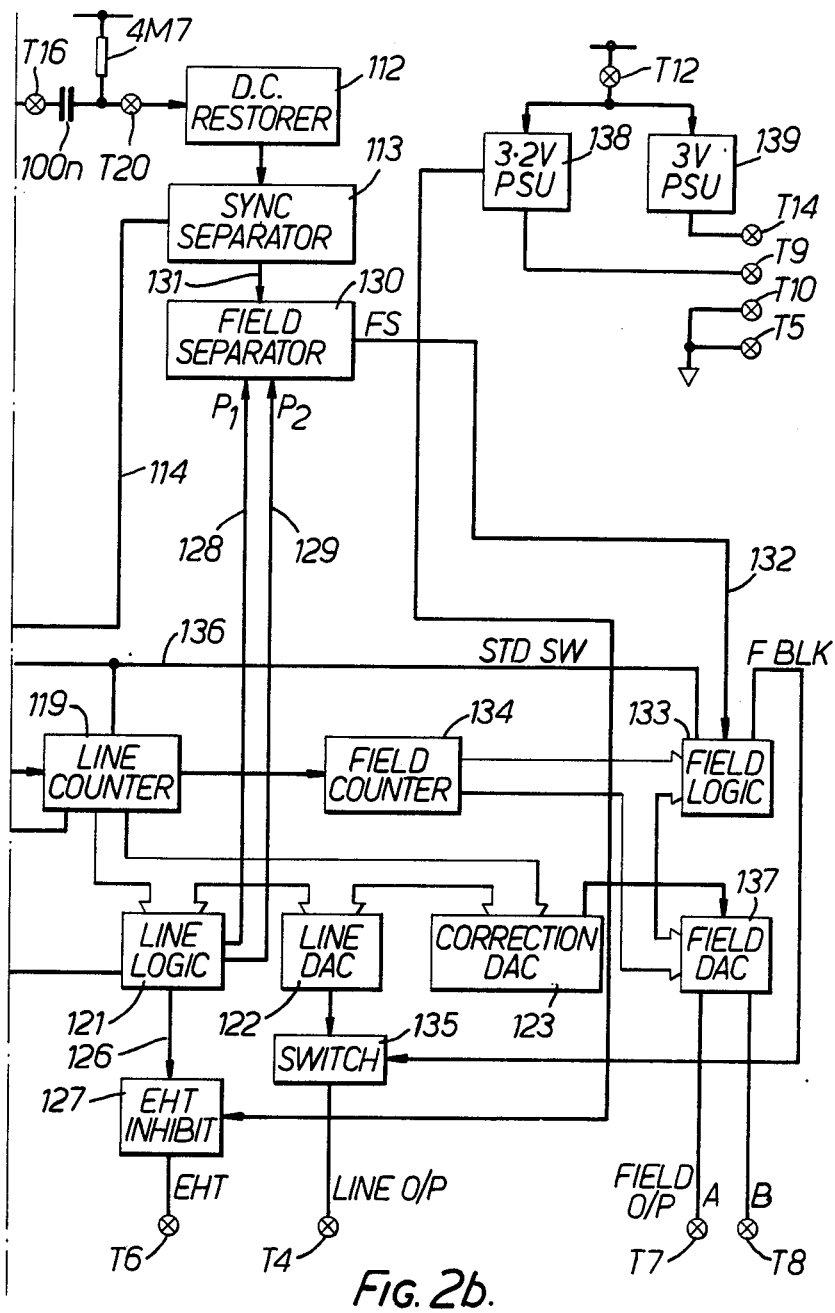

FIG. 2 shows a block diagram of the circuits contained in the integrated circuit 9 of FIG. 1, and in FIG. 2 the numbered terminals of the integrated circuit package are preceded by the letter T so that the first terminal is T1 and the last is T22. The output of the tuner 7 (FIG. 1) is connected via terminal T19 to an intermediate frequency amplifier 100. The amplified output from the IF amplifier 100 is applied to a detector 101 and from that through a video amplifier 102 to the terminal T16. An AGC signal for the amplifier 100 is derived from the amplifier 102 by an AGC detector 103 from which the AGC signal amplified by amplifier 104 is applied to control the gain of the amplifier 100. A capacitor 105 external to the integrated circuit is connected via terminal T17 to the output of the detector 103 to smooth the gain control voltage. The intercarrier sound is picked off from the output of the video detector 101 and applied via a conductor 106 to a sound channel mixer 107. The oscillation from a local oscillator 108 is mixed with the sound signal from the output of the detector 101 to produce the required intermediate frequency signal which is amplified by IF amplifier 109, the amplified output of which is applied to a demodulator circuit 101 connected to apply the sound output signal to terminal T15. The potentiometer 11 serves as a volume control and regulates the amplitude of the audio signal reapplied to the integrated circuit at terminal T13 for amplification in the AF amplifier 111. The output audio signal is fed via the terminal T11 and a capacitor to the loudspeaker 10.

The video output signal from the amplifier 102 which appears at the terminal T16 is applied as described above with reference to FIG. 1 to the grid of the cathode ray display tube 1. It is also reapplied to the integrated circuit via terminal T20 from which it is applied via a DC restoration circuit 112 to a sync separator circuit 113. Pulses at line frequency are conveyed by a conductor 114 to a monostable multivibrator 115 and an IN LOCK detector 116. A picture element frequency oscillator 117 which has its frequency controlled by the output of a phase detector 118 applies pulses to a counter 119 of which the most significant bit output is fed via a conductor 120 to an input of the phase detector 118 which compares the time of arrival of the most significant bit with the output of the monostable 115. The output of the phase detector 118 also controls the frequency of the local oscillator 108. When operating correctly the frequency of occurrence of the most significant bit signals on the conductor 120 will be at line frequency. The digital output of the counter 119 is applied to a line logic circuit 121, a line digital to analogue converter 122 and a correction digital to analogue converter 123. The line logic circuit 121 produces a gate signal which is applied to the phase detector 118 through an INHIBIT circuit 124 for limiting the time period over which the phase detector 118 is effective near each most significant bit output from the counter 119. The IN LOCK detector circuit 116 compares the timing of the line frequency pulses on the conductor 114 with the gate signals from the line logic circuit 121 on conductor 125 and is connected to the INHIBIT circuit 124 to prevent the gate signals from being applied to the phase detector 118 unless the output of the line counter 119 is substantially synchronised with the signals from the monostable 115. The line logic circuit 121 output on the conductor 125 is also applied to the INHIBIT circuit 124. The line logic circuit 121 produces another output on the conductor 126 which is applied to an EHT INHIBIT circuit 127 connected to terminal T6 of the integrated circuit. This part of the circuit functions to inhibit the generation of pulses at line frequency at the terminal T6 when the voltage of the battery 2 falls below 4.3 volts to prevent the display of a distorted picture. The digital to analogue converter 122 produces line deflection rate controlling waveforms for controlling the integrators 27 and 28 (FIG. 1) which generate the line scan waveforms and needed because of the geometry of the cathode ray tube 1. The purpose and operation of the digital to analogue converter 123 will be described later. The line logic circuit 121 also produces signals P1 and P2 identifying the odd and even fields on conductors 128 and 129 which are applied to a field separator circuit 130 which receives the field frequency pulses from the sync separator 113 via a conductor 131. The field sync pulses from the separator 130 are applied via a conductor 132 to a field logic circuit 133 which receives the digital output from a field counter 134 driven by pulses from the counter 119. Blanking signals from the field logic circuit 133 are fed to a switch 135 to ground the terminal T4 and thereby hold the cathode ray tube spot at the left-hand side of the frame during field flyback. The field logic circuit 133 also produces line number standard switch output which is conveyed via a conductor 136 to the oscillators 108 and 117 and to the line and field counters 119 and 134 to enable the receiver to handle different television standards. The digital outputs from the field counter 134 are also applied to a field digital to analogue converter 137 which produces field scan drive signals on terminals T7 and T8. The output of the correction digital to analogue converter 123 is applied as the reference voltage for the converter 137. This correction is needed because the cathode ray tube 1 is a flat tube in which the screen lies end on to the electron gun. It will be appreciated that with a tube of this type if the field deflection voltage is kept constant whilst the line deflection voltage is varied to generate a line, the resulting picture would be trapezoidal in shape. In order to produce a rectangular picture, it is necessary to adjust the field deflection voltage as a line is described by the spot and the purpose of the converter 123 is to cause the field deflection voltage output of the field digital to analogue converter 137 to be adjusted according to the position of the spot along the line so as to produce a rectangular picture. The integrated circuit 9 also includes a 3.2 volt power supply 138 and a 3 volt power supply 139 energised from the main battery supply line 4 via terminal T12. The 3.2 volt supply is connected internally to the EHT INHIBIT circuit 127 and to the terminal T9. The 3 volt supply is connected just to the terminal T14. Earth connections are provided at terminals T5 and T10 and terminals T1, T3, T21 and T22 are provided for the connection of relatively large capacitances to the circuit.

It is not proposed to enter into a detailed description of the generation of the scanning signals and the operation of the circuits directly associated with this because these form the subject of other copending patent applications. The operation of the parts of the integrated circuit is otherwise fairly conventional for a television receiver, but where the circuit departs from the usual it will either be described later on in the present patent application or in another co-pending patent application.

Figure 3:
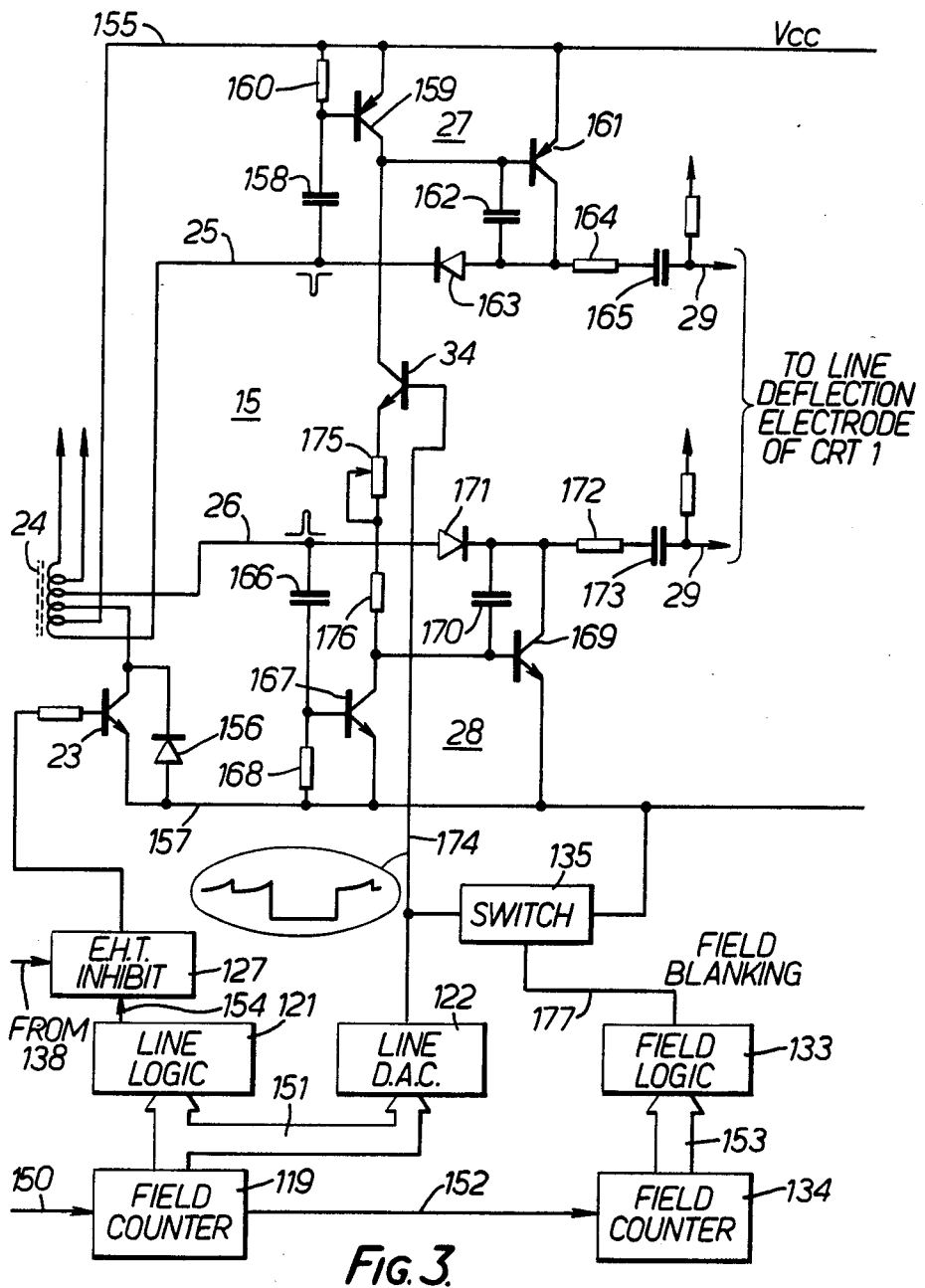
FIG. 3 is a diagram partly in block form of the part of the television receiver of FIG. 1 containing the invention.

In FIG. 3, which shows the parts of FIGS. 1 and 2 relevant to the present invention, the parts have the same references as are employed in those figures. Pulses at picture element frequency from the line oscillator 117 (FIG. 2) are applied to the line counter 119 via a conductor 150 which produces its count as a parallel output on conductors 151 which are applied to the line logic circuit 121 and the line digital to analogue converter 122. In additionn, the counter 119 produces pulses at line frequency on a conductor 152 which are applied as inputs to the field counter 134. The count of the field counter 134 is applied in parallel via conductors 153 to the field logic circuit 133. The line logic circuit 121 produces output pulses at line frequency on a conductor 154 which after passage through the EHT INHIBIT circuit 127 are applied to the base electrode of the transistor 23. The pulses are negative-going so that they switch the transistor 23 from conducting to non-conducting. The interrupted collector current of the transistor 23 passes through part of the winding of the autotransformer 24 to a supply conductor 155 maintained at the full voltage of the battery ($V_{CC}$). A diode 156 is connected in parallel with the emitter collector path of the transistor 23 to pass negative-going pulses at the collector of the transistor to the ground conductor 157. Two tappings on the winding of the autotransformer are connected to power supply generation circuits which respond to the pulse energisation of the winding of the transformer 24 to generate the high voltage supplies for the cathode ray tube. The conductors 25 and 26 which are connected to other tappings on the winding of the transformer 24 have negative-going and positive-going pulses respectively set up on them in response to the pulse energisation of the transformer 24. The conductor 25 is connected through a capacitor 158 to the base of a transistor 159 of which the emitter is connected to the conductor 155 and its base is connected through a resistor 160 to the conductor 155. The collector of the transistor 159 is connected to the base of a transistor 161 which has a feedback capacitor 162 connected from its collector to its base to form an integrator circuit. The emitter of the transistor 161 is connected to the conductor 155 and its collector is connected through a diode 163 to the conductor 125, and it is also connected through a resistor 164 and a capacitor 165 in series to the conductor 29 which is connected to one of the line deflection plates of the cathode ray tube 1 (FIG. 1). The conductor 26 is connected through a capacitor 166 to the base of a transistor 167 whose emitter is connected to the conductor 157. The base of the transistor 167 is connected to the conductor 157 through a resistor 168. The collector of the transistor 167 is connected to the base of a transistor 169 having a capacitor 170 connected from its collector to its base to form an integrator circuit. The collector of the transistor 169 is connected through a diode 171 to the conductor 26 and through a resistor 172 and a capacitor 173 in series to the conductor 29 leading to the other line deflection plate of the cathode ray tube 1 (FIG. 1). The emitter of the transistor 169 is connected to the conductor 157. The output voltage of the line digital to analogue converter 122 is connected via a conductor 174 to the base of the transistor 34 of which the emitter collector path is connected in series with an adjustable resistor 175 and a fixed resistor 176 from the base of the transistor 161 to the base of the transistor 169. The conductor 174 is connected to the conductor 157 through the switch 135 which is controlled by a field blanking pulse from the field logic circuit 133 which appears on conductor 177.

In the operation of the circuit of FIG. 3, pulses at line frequency from the line logic circuit 121 are applied to switch off the transistor 23 from its normally conducting state unless they are prevented from being applied to that transistor by the EHT INHIBIT circuit 127 which responds to an output from a power supply in the integrated circuit which indicates that the battery voltage is too low for satisfactory operation of the receiver. The pulses applied to the transistor 23 appear as negative-going and positive-going pulses respectively on the conductors 25 and 26. In the upper integrator circuit 27 the negative-going pulse is applied to the base of the transistor 159 through the capacitor 158 causing it to become conducting and thereby effectively connecting one electrode of the capacitor 162 to the conductor 155. The other electrode of the capacitor 162 is held at the negative-going peak voltage on the conductor 25 by virtue of the connection through the diode 163. In this way, the negative-going pulse establishes a charge on the capacitor 162. In a similar way the positive-going pulse on the conductor 26 establishes a corresponding charge on the capacitor 170. At the end of each pulse on the conductors 25 and 26 current flows through the emitter-collector path of the transistor 34 and the resistors 175 and 176 between the base of the transistor 161 and the base of the transistor 169. These transistors with their feedback capacitors 162 and 170 act as integrator circuits and the collector voltages of the transistors execute positive-going and negative-going ramps respectively as the charges on their associated capacitors are changed by the common current through the path joining the base electrodes of the transistors. The output of the line digital to analogue converter 122 controls the conductivity of the transistor 34 while the ramps are being described so that the particular shaping required to produce the desired linear line scan of the cathode ray tube 1 is produced. By virtue of the fact that the description of the ramps produced by the two integrators is controlled by a common current path from one integrator to the other, it follows that the control of the two ramps in the required balanced manner is easily effected and the required non-linearities are easily introduced into both waveforms.

The switch 135 which connects the conductor 174 to the conductor 157 is rendered conducting by a field blanking pulse from the field logic circuit 133 which has the effect that the voltage on the line 174 is clamped to ground potential during the field flyback. The effect of holding the conductor 174 at ground potential is to prevent the transistor 34 from becoming conducting at this time so that the charges on the capacitors 162 and 170 are not affected and retain their extreme values to which they are set by the pulses on the conductors 25 and 26 respectively for the duration of the field flyback. This has the advantage that the spot on the cathode ray tube display is held at the left-hand side of the picture at this time and cannot appear as an undesirable wavy line over the area of the picture itself.

Although the invention has been described with reference to a specific embodiment, it will be appreciated that it is not limited to the details of this embodiment and in particular the invention could be applied to other types of cathode ray tube apparatus using electrostatic deflection, for example, a cathode ray tube display for a computer.

What we claim is:

1. A cathode ray tube display apparatus for generating an image by projecting a flying spot on a screen, having line and field scanning circuits in which a coupling is provided from the field scanning circuit to the line scanning circuit to hold the spot off the screen during field flyback.

2. The apparatus according to claim 1 wherein the line scanning circuit is such as to reset the spot from one side of the screen to the other in response to line frequency pulses and then performs a forward sweep to move the spot back from the other side of the screen, and the field scanning circuit produces an output during field flyback which is applied to inhibit the forward sweep of the line scanning circuit.

3. The apparatus according to claim 2 wherein the line scanning circuit includes integrator means for generating the forward sweep and a current path connected to the integrator means for determining the slope of the forward sweep, the current path including a device for controlling the current through the current path, which device is responsive to the output of the field scanning circuit.

4. The apparatus according to claim 1 including a cathode ray tube having electrostatic deflection plates, and a scanning circuit producing substantially identical sawtooth voltage waveforems of opposite polarities on two output conductors, wherein the circuit includes two complementary amplifiers, each having capacitive feedback to form an integrator circuit and being connected to a respective output conductor, a current path connected between the inputs of the amplifiers providing the current inputs to define the sloping flanks of the sawtooth waveforms, and means for periodically restoring the charges on the capacitors of the integrators to datum values.

5. The apparatus according to claim 4 wherein the amplifiers are respectively referenced to positive and negative supply conductors.

6. The apparatus according to claim 2 wherein the amplifiers are single bipolar transistors of complementary conductivity type connected in common emitter mode.

7. The apparatus according to claim 4 wherein the means for periodically restoring the charges on the capacitors includes a source of synchronised trains of pulses of opposite polarity and for each integrator an inverting amplifier to which the respective train of pulses is applied, the pulses of the respective train and the inverted pulses of that train being applied to the capacitors of each integrator to restore the charge thereon.

8. The apparatus according to claim 4 wherein for each integrator the inverting amplifier is caused to conduct by the pulses of the respective train and connects the input of the integrator amplifier to a supply conductor, the train of pulses being applied to the output of the integrator amplifier through a diode of appropriate polarity.

9. The apparatus according to claim 4 wherein the source of trains of pulses includes a transformer winding having an intermediate tapping connected to a supply conductor and connections on opposite sides of the intermediate tapping from which the trains of pulses of opposite polarity are obtained, the transformer being driven by pulses of line frequency and being used in a circuit to generate E.H.T. for a cathode ray tube.

10. The apparatus according to claim 4 wherein the current path includes variable resistance means for similarly adjusting the amplitudes of the sawtooth waveforms.

11. The apparatus according to claim 1 wherein the current path includes a device for controlling the current through the path during each sloping flank of the sawtooth waveform so as to enable the waveform to be shaped to suit the deflection characteristics of a particular cathode ray tube.

* * * * *